United States Patent
Ohshima et al.

(10) Patent No.: US 12,520,637 B2
(45) Date of Patent: Jan. 6, 2026

(54) LIGHT-EMITTING ELEMENT PRODUCING METHOD AND LIGHT-EMITTING ELEMENT

(71) Applicant: SHARP KABUSHIKI KAISHA, Sakai (JP)

(72) Inventors: Akira Ohshima, Sakai (JP); Jun Sakuma, Sakai (JP); Sentaro Kida, Sakai (JP); Makoto Kitagawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 476 days.

(21) Appl. No.: 18/027,904

(22) PCT Filed: Oct. 7, 2020

(86) PCT No.: PCT/JP2020/037932
§ 371 (c)(1),
(2) Date: Mar. 22, 2023

(87) PCT Pub. No.: WO2022/074751
PCT Pub. Date: Apr. 14, 2022

(65) Prior Publication Data
US 2023/0369545 A1   Nov. 16, 2023

(51) Int. Cl.
*H10H 20/851*  (2025.01)
*H10H 20/01*   (2025.01)
*H10H 20/816*  (2025.01)
*H10H 20/83*   (2025.01)

(52) U.S. Cl.
CPC ...... *H10H 20/8512* (2025.01); *H10H 20/816* (2025.01); *H10H 20/83* (2025.01); *H10H 20/034* (2025.01)

(58) Field of Classification Search
CPC .. H10H 20/8512; H10H 20/83; H10H 20/816; H10H 20/034
See application file for complete search history.

(56) References Cited

U.S. PATENT DOCUMENTS

| | | |
|---|---|---|
| 2012/0223291 A1 | 9/2012 | Klem et al. |
| 2012/0241723 A1 | 9/2012 | Klem et al. |
| 2014/0225063 A1 | 8/2014 | Klem et al. |

(Continued)

FOREIGN PATENT DOCUMENTS

| | | |
|---|---|---|
| CN | 107394020 A | 11/2017 |
| JP | 2013506302 A | 2/2013 |

(Continued)

*Primary Examiner* — Mark W Tornow
(74) *Attorney, Agent, or Firm* — ScienBiziP, P.C.

(57) ABSTRACT

A light-emitting element producing method includes: a step of forming a first-charge transport layer on a first electrode; a step of applying a first photosensitive resin composition, containing first quantum dots, to the first-charge transport layer, and forming a first-quantum-dot containing layer; a step of applying a second photosensitive resin composition, containing second quantum dots, to the first-quantum-dot containing layer, and forming a second-quantum-dot containing layer; a step of forming a second-charge transport layer on the second-quantum-dot containing layer; and a step of forming a second electrode on the second-charge transport layer.

17 Claims, 4 Drawing Sheets

(56) References Cited

U.S. PATENT DOCUMENTS

| | | | |
|---|---|---|---|
| 2015/0008390 A1 | 1/2015 | Lewis et al. | |
| 2019/0334064 A1 | 10/2019 | Pourquier et al. | |
| 2022/0149249 A1* | 5/2022 | Kubo | H10H 20/835 |
| 2022/0263039 A1* | 8/2022 | Angioni | H10K 50/15 |
| 2022/0367830 A1* | 11/2022 | Jung | C07D 403/10 |
| 2022/0393061 A1* | 12/2022 | Boardman | H10K 71/233 |
| 2023/0422553 A1* | 12/2023 | Sakakibara | H05B 33/12 |
| 2024/0141227 A1* | 5/2024 | Ueta | H10K 50/115 |

FOREIGN PATENT DOCUMENTS

| | | |
|---|---|---|
| JP | 2013125653 A | 6/2013 |
| JP | 2020507201 A | 3/2020 |
| WO | 2012128173 A1 | 9/2012 |

\* cited by examiner

LIGHT-EMITTING ELEMENT PRODUCING METHOD AND LIGHT-EMITTING ELEMENT

TECHNICAL FIELD

The present disclosure relates to a light-emitting element producing method and a light-emitting element.

BACKGROUND ART

Japanese Unexamined Patent Application Publication No. 2013-125653 discloses, for example, a light-emitting element including a plurality of light-emitting layers sandwiched between an anode and a cathode.

SUMMARY

Technical Problem

In the light-emitting element described in Japanese Unexamined Patent Application Publication No. 2013-125653, for example, each of the plurality of light-emitting layers contains: a light-emitting material; a hole transport material; and an electron transport material. In such a case, holes and electrons; namely, carriers, are likely to concentrate on interface surfaces, between the plurality of light-emitting layers, through which the holes and the electrons are readily transported. Then, the light-emitting materials contained in the light-emitting layers and found near these interface surfaces emit light. That is why the light-emitting materials near the interface surfaces are likely to have heavy load. The heavy load could reduce the life of the light-emitting element. The present disclosure is essentially intended to provide, for example, a light-emitting element producing method to reduce deterioration of the light-emitting element.

Solution to Problem

A light-emitting element producing method according to an aspect of the present disclosure includes: a step of forming a first-charge transport layer on a first electrode; a step of applying a first photosensitive resin composition, containing first quantum dots, to the first-charge transport layer, and forming a first-quantum-dot containing layer; a step of applying a second photosensitive resin composition, containing second quantum dots, to the first-quantum-dot containing layer, and forming a second-quantum-dot containing layer; a step of forming a second-charge transport layer on the second-quantum-dot containing layer; and a step of forming a second electrode on the second-charge transport layer.

A light-emitting element according to an aspect of the present disclosure includes: a first electrode; a second electrode; a light-emitting layer provided between the first electrode and the second electrode; a first-charge transport layer provided between the first electrode and the light-emitting layer; and a second-charge transport layer provided between the second electrode and the light-emitting layer. The light-emitting layer includes: a first-quantum-dot containing layer positioned toward the first-charge transport layer and containing first quantum dots; and a second-quantum-dot containing layer positioned toward the second-charge transport layer and containing second quantum dots. In the first-quantum-dot containing layer, the first quantum dots are unevenly distributed toward the first-charge transport layer and the second-quantum-dot containing layer.

DESCRIPTION OF EMBODIMENTS

Described below are examples of preferable embodiments according to the disclosure. Note that the embodiments below are mere examples. The disclosure shall not be limited to the embodiments below.

First Embodiment

Figure 1:
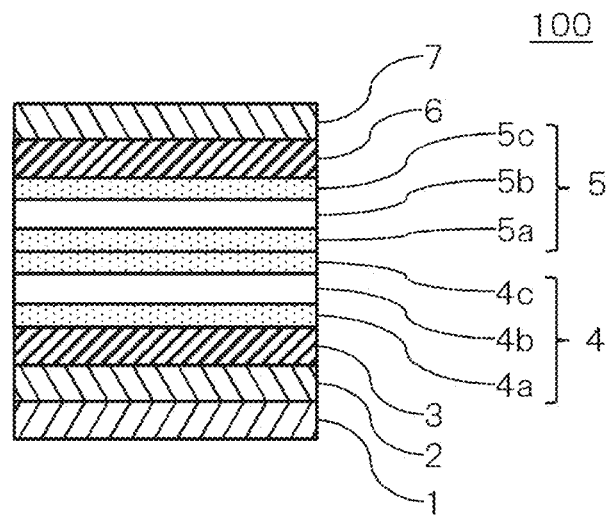
FIG. 1 is a schematic view showing an exemplary multilayer structure of a light-emitting element according to a first embodiment.
Figure 2:
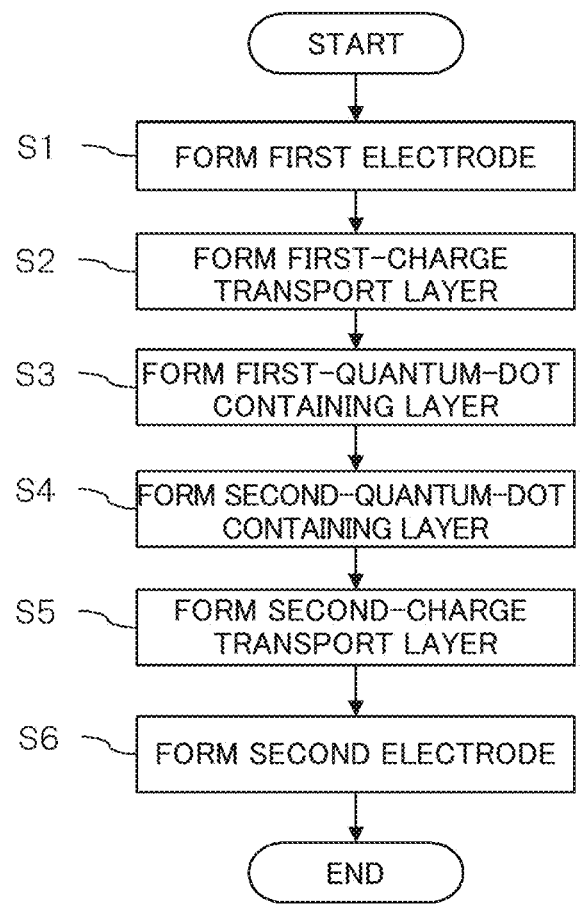
FIG. 2 is a flowchart showing an exemplary method for producing the light-emitting element according to the first embodiment.

FIG. 1 is a schematic view showing an exemplary multilayer structure of a light-emitting element 100 according to this embodiment. FIG. 2 is a flowchart showing an exemplary method for producing the light-emitting element 100 according to this embodiment.

As illustrated in FIG. 1, for example, the light-emitting element 100 according to this embodiment includes: a first electrode 2; a first-charge transport layer 3, a first-quantum-dot containing layer 4; a second-quantum-dot containing layer 5; a second-charge transport layer 6; and a second electrode 7, all of which are stacked in this order above a substrate 1.

The light-emitting element 100 emits light. This embodiment exemplifies a case where the light-emitting element 100 is one subpixel in a display device. For example, a plurality of the subpixels emitting light in different colors constitute one pixel, and a plurality of the pixels are arranged in a matrix to successfully form a display device.

Described below is a method for producing the light-emitting element 100.

First, the substrate 1 is prepared. The substrate 1 is made of, for example, such a material as glass. The substrate 1 functions as a support body to support the above layers. The substrate 1 may be, for example, an array substrate formed of such devices as thin-film transistors (TFTs).

On the substrate 1, the first electrode 2 is formed (S1). The first electrode 2 can be formed by a known technique such as, for example, sputtering, or vacuum evaporation. The first electrode 2 supplies the first-quantum-dot containing layer 4 and the second-quantum-dot containing layer 5 with first charges. The first electrode 2 can be either an anode or a cathode.

The first electrode 2 is made of, for example, a conductive material such as metal or transparent conductive oxide. Examples of the metal include Al, Cu, Au, and Ag. Examples of the transparent conductive oxide include indium tin oxide (ITO), indium zinc oxide (IZO), zinc oxide (ZnO), aluminum zinc oxide (ZnO: Al(AZO)), and boron zinc oxide (ZnO: B(BZO)). Note that the first electrode 2 may also be a multilayer stack including, for example, at least one metal layer and/or at least one transparent conductive oxide layer.

On the first electrode 2, the first-charge transport layer 3 is formed (S2). The charge transport layer 3 can be formed by a known technique such as, for example, vacuum evaporation, sputtering, or coating. The first-charge transport layer 3 transports the first charges, supplied from the first electrode 2, to the first-quantum-dot containing layer 4 and the second-quantum-dot containing layer 5. The first-charge transport layer 3 contains a first-charge transporting material capable of transporting the first charges. The first-charge transport layer 3 can be a hole transport layer or an electron transport layer.

Examples of materials forming the hole transport layer include: a material containing one or more selected from a group consisting of an oxide, a nitride, or a carbide containing any one or more of Zn, Cr, Ni, Ti, Nb, Al, Si, Mg, Ta, Hf, Zr, Y, La, and Sr; such a material as 4, 4', 4"-tris(9-carbazolyl)triphenylamine (TCTA), 4,4'-bis[N-(1-naphthyl)-N-phenyl-amino]biphenyl (NPB), zinc phthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), or $MoO_3$; and such a hole transporting organic material as poly(N-vinylcarbazole) (PVK), poly(2,7-(9,9-di-n-octylfluorene)-(1,4-phenylene((4-sec-butylphenyl)imino)-1,4-phenylene (TFB), poly(triphenylamine) derivative (poly-TPD), or poly(3,4-ethylenedioxythiopheneypoly(4-styrene sulfonate) (PEDOT-PSS). These hole transporting materials may be used alone or in appropriate combination of two or more.

Examples of materials forming the electron transport layer include such electron transporting materials as zinc oxide (e.g., ZnO), titanium oxide (e.g., $TiO_2$), and strontium titanium oxide (e.g., $SrTiO_3$). These electron transporting materials may be used alone or in appropriate combination of two or more.

The materials forming these hole transport layer and electron transport layer may be selected appropriately, depending on a configuration and a characteristic of the light-emitting element 100. Note that the first-charge transport layer 3 may be formed of one layer or a plurality of layers.

On the first-charge transport layer 3, the first-quantum-dot containing layer 4 is formed (S3). The first-quantum-dot containing layer 4 is formed of, for example, as follows: a first photosensitive resin composition containing first quantum dots is applied to the first-charge transport layer 3 and fired to form the first-quantum-dot containing layer 4. The first-quantum-dot containing layer 4 contains the first quantum dots as a light-emitting material, and functions as a light-emitting layer.

More specifically, on the first-charge transport layer 3, the first photosensitive resin composition is applied to form a first photosensitive resin composition layer, so that the first quantum dots are unevenly distributed: toward the first-charge transport layer 3 in the first photosensitive resin composition layer; and in a top of the first photosensitive resin composition layer. On the top of the first photosensitive resin composition layer, the second-quantum-dot containing layer 5 will be formed later, and the phrase "the top of the first photosensitive resin composition layer" can also be referred to as a phrase "toward the second-quantum-dot containing layer 5". Note that, the first photosensitive resin composition layer is formed, and after that, the first quantum dots are, for example, left for a predetermined time period and unevenly distributed in the first photosensitive resin composition layer. Then, in the first photosensitive resin composition layer, the first quantum dots are unevenly distributed and then fired. Hence, as illustrated in FIG. 1, the first-quantum-dot containing layer 4 can be formed to include: a first layer 4a containing the first quantum dots in large amount, the first quantum dots being unevenly distributed toward the first-charge transport layer 3; a second layer 4b hardly containing the first quantum dots; and a third layer 4c containing the first quantum dots in large amount, the first quantum dots being unevenly distributed toward the second-quantum-dot containing layer 5.

The first photosensitive resin composition is a coating liquid made of a photosensitive resin composition such as a so-called photoresist and the first quantum dots mixed together. This photoresist is either a positive photoresist or a negative photoresist, and contains, for example, resin and solvent. Preferable examples of the resin include an acrylic resin and a polyimide resin. Moreover, the first photosensitive resin composition may contain a first-charge transporting material. If the first photosensitive resin composition contains the first-charge transporting material, the second layer 4b readily transports the first charges.

The first quantum dots are semiconductor particulates having a particle size of, for example, 100 nm or less. Examples of the first quantum dots include: a crystal of II-VI semiconductor compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, and/or a crystal of III-V semiconductor compounds such as GaAs, GaP, InN, InAs, InP, and InSb, and/or a crystal of IV semiconductor compounds such as Si and Ge. Moreover, each of the quantum dots may have, for example, a core-shell structure including the semiconductor crystal as a core and a high-bandgap shell material coating the core.

On the first-quantum-dot containing layer 4, the second-quantum-dot containing layer 5 is formed (S4). The second-quantum-dot containing layer 5 is formed, for example, as follows: a second photosensitive resin composition containing second quantum dots is applied to the first-quantum-dot containing layer 4 and fired to form the second-quantum-dot containing layer 5. The second-quantum-dot containing layer 5 contains the second quantum dots as a light-emitting material, and functions as a light-emitting layer. The light-emitting layer is made of, for example, the first photosensitive resin composition and the second photosensitive resin composition. These compositions are exposed to light, and developed to be patterned into a predetermined shape to form the light-emitting layer. Moreover, as to the light-emitting element 100, a hardened material of the first photosensitive resin composition remains in the first-quantum-dot containing layer 4, and a hardened material of the second photosensitive composition remains in the second-quantum-dot containing layer 5.

More specifically, on the first-quantum-dot containing layer 4, the second photosensitive resin composition is applied to form a second photosensitive resin composition layer, so that the second quantum dots are unevenly distributed: in the second photosensitive resin composition layer toward the first-quantum-dot containing layer 4; and in a top of the second photosensitive resin composition layer. On the top of the second photosensitive resin composition layer, the second-charge transport layer 6 will be formed later, and the phrase "the top of the second photosensitive resin composition layer" can also be referred to as a phrase "toward the second-charge transport layer 6". Note that, the second photosensitive resin composition layer is formed, and after that, the second quantum dots are, for example, left for a predetermined time period and unevenly distributed in the second photosensitive resin composition layer. Then, in the second photosensitive resin composition layer, the second quantum dots are unevenly distributed and then fired. Hence, as illustrated in FIG. 1, the second-quantum-dot containing layer 5 can be formed to include: a first layer 5a containing the second quantum dots in large amount, the second quantum dots being unevenly distributed toward the first-quantum-dot containing layer 4; a second layer 5b hardly containing the second quantum dots; and a third layer 5c containing the second quantum dots in large amount, the second quantum dots being unevenly distributed toward the second-charge transport layer 6.

The second photosensitive resin composition is a coating liquid made of a photosensitive resin composition such as a so-called photoresist and the second quantum dots mixed together. This photoresist is either a positive photoresist or a negative photoresist, and includes, for example, resin and solvent. Preferable examples of the resin include an acrylic resin and a polyimide resin. Moreover, the second photosensitive resin composition may contain a second-charge transporting material. If the second photosensitive resin composition contains the second-charge transporting material, the second layer 5b readily transports the second charges.

The second quantum dots are similar to the first quantum dots. The second quantum dots may be either the same as, or different from, the first quantum dots.

On the second-quantum-dot containing layer 5, the second-charge transport layer 6 is formed (S5). Similar to the first-charge transport layer 3, the second-charge transport layer 6 can be formed by a known technique such as, for example, vacuum evaporation, sputtering, or coating. As will be described later, the second-charge transport layer 6 transports the second charges, supplied from the second electrode 7, to the second-quantum-dot containing layer 5 and the first-quantum-dot containing layer 4. The second-charge transport layer 6 can be a hole transport layer or an electron transport layer. The second-charge transport layer 6 can be formed of the same material as that of the first-charge transport layer 3.

On the second-charge transport layer 6, the second electrode 7 is formed (S6). The second electrode 7 can be formed by a conventionally known technique such as, for example, sputtering, or vacuum evaporation. The second electrode 7 supplies the first-quantum-dot containing layer 4 and the second-quantum-dot containing layer 5 with the second charges. The second electrode 7 can be either an anode or a cathode. The second electrode 7 can be formed of the same material as that of the first electrode 2.

By the steps described above, the light-emitting element 100 illustrated in FIG. 1 can be produced.

Note that either the first electrode 2 or the second electrode 7 is made of a light-transparent material. Note that either the first electrode 2 or the second electrode 7 may be made of a light-reflective material. If the light-emitting element 100 is a top-emission light-emitting element, for example, the second electrode 7 provided above is formed of a light-transparent material and the first electrode 2 provided below is formed of a light-reflective material. Moreover, if the light-emitting element 100 is a bottom-emission light-emitting element, for example, the second electrode 7 provided above is formed of a light-reflective material and the first electrode 2 provided below is formed of a light-transparent material. Furthermore, either the first electrode 2 or the second electrode 7 may be a multilayer stack made of a light-transparent material and a light-reflective material, so that the electrode can reflect light.

The light-transparent material may be, for example, a transparent conductive material. Specific examples of the light-transparent material may include: indium tin oxide (ITO); indium zinc oxide (IZO); tin oxide ($SnO_2$); and fluorine-doped tin oxide (FTO). Because these materials are highly transparent to visible light, the light-emitting element 100 improves light-emission efficiency.

The light-reflective material may be, for example, a metal material. Specific examples of the light-reflective material may include: aluminum (Al); silver (Ag); copper (Cu); and gold (Au). Because these materials are highly reflective to visible light, the light-emitting element 100 improves light-emission efficiency.

Moreover, for example, if the first electrode 2 is an anode and the second electrode 7 is a cathode, the first charges are holes, the second charges are electrons, the first-charge transport layer 3 is a hole transport layer, and the second-charge transport layer 6 is an electron transport layer. Furthermore, for example, if the first electrode 2 is a cathode and the second electrode 7 is an anode, the first charges are electrons, the second charges are holes, the first-charge transport layer 3 is an electron transport layer, and the second-charge transport layer 6 is a hole transport layer. For example, each of the hole transport layer and the electron transport layer may be formed of a monolayer or a multilayer. If the hole transport layer is of a multilayer structure, a layer capable of injecting the holes is positioned, for example, closest to the anode. Furthermore, if the electron transport layer is of a multilayer structure, a layer capable of injecting the electrons is positioned, for example, closest to the cathode.

Figure 3:
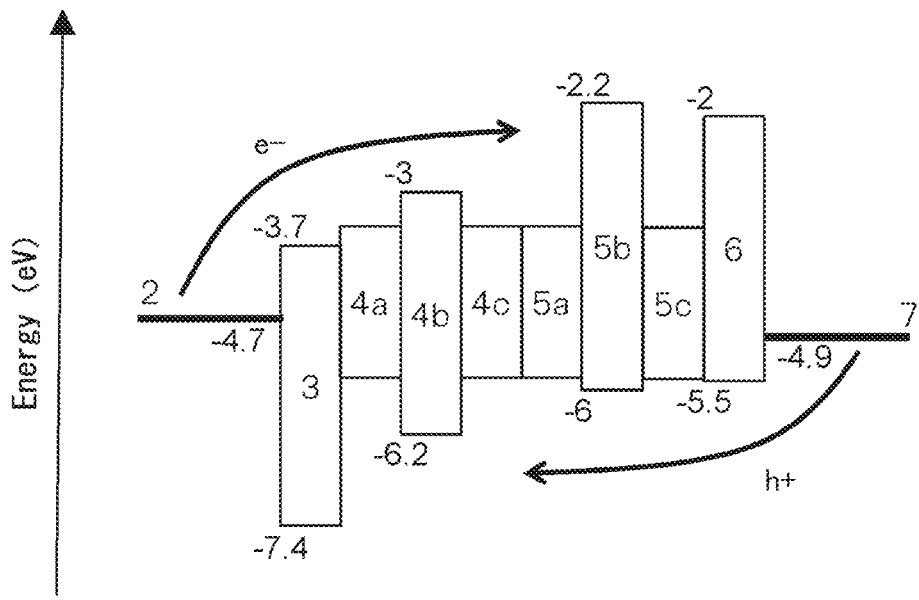
FIG. 3 is an exemplary energy level diagram of the light-emitting element according to the first embodiment.

Here, as to the light-emitting element 100 according to this embodiment, FIG. 3 is an exemplary energy level diagram when the first electrode 2 is a cathode (Ag), the first-charge transport layer 3 is an electron transport layer (MgZnO), the second-charge transport layer 6 is a hole transport layer (TAPC), and the second electrode 7 is an anode (ITO). Moreover, FIG. 3 shows an exemplary case where the first-quantum-dot containing layer 4 is made of a photosensitive resin composition whose resin is an acrylic resin and the second-quantum-dot containing layer 5 is made of a photosensitive resin composition whose resin is a polyimide resin.

Note that each of the layers may contain an organic material or an inorganic material (an inorganic crystalline material). For example, if each layer contains an organic material, FIG. 3 shows that an upper end of the layer represents an energy level at the LUMO and a lower end of the layer represents an energy level at the HOMO. Moreover, if each layer contains an inorganic material (an inorganic crystalline material), FIG. 3 shows that an upper end of the layer represents an energy level at the conduction band minimum (CBM) and a lower end of the layer represents an energy level at the valence band maximum (VBM). Furthermore, an amount of energy required to obtain the electrons from the energy level at the LUMO, or from the energy level at the CBM, to the vacuum level corresponds to electron affinity, and an amount of energy required to obtain the electrons from the energy level at the HOMO, or from the energy level at the VBM, to the vacuum level corresponds to ionization potential. This ionization potential corresponds to a value representing the electron affinity and a bandgap added together.

As illustrated in FIG. 3, for example, from the first electrode 2 serving as the cathode, the electrons are transported through the first-charge transport layer 3 serving as the electron transport layer to the first-quantum-dot containing layer 4 and the second-quantum-dot containing layer 5. Meanwhile, from the second electrode 7 serving as the anode, the holes are transported through the second-charge transport layer 6 serving as the hole transport layer to the second-quantum-dot containing layer 5 and the first-quantum-dot containing layer 4.

The first quantum-dot containing layer 4 includes the first layer 4a and the third layer 4c both containing the first quantum dots in large amount, and the second layer 4b hardly containing the first quantum dots. Likewise, the second quantum-dot containing layer 5 includes the first layer 5a and the third layer 5c both containing the second quantum dots in large amount, and the second layer 5b hardly containing the second quantum dots. That is, the third layer 4c of the first-quantum-dot containing layer 4 and the first layer 5a of the second-quantum-dot containing layer 5 are positioned close to the center of the light-emitting layer including the first quantum-dot containing layer 4 and the second quantum-dot containing layer 5. Typically, the electrons and the holes are likely to recombine together close to the center of the light-emitting layer. Hence, the electrons and the holes recombine together with high probability at the third layer 4c containing the first quantum dots in large amount and the first layer 5a containing the second quantum dots in large amount. Here, both of the layers are positioned close to the center of the light-emitting layer as described above. As a result, the light-emitting element 100 improves light emission efficiency.

Moreover, because the second layer 4b of the first-quantum-dot containing layer 4 hardly contains the first quantum dots, the essential ingredient of the second layer 4b is a resin ingredient of the first photosensitive resin composition (e.g., a hardened material of the first photosensitive resin composition) to be used when the second layer 4b is formed. The example in FIG. 3 shows that the hardened material of the first photosensitive resin composition is higher in ionization potential than the hardened material of the second photosensitive resin composition, and that the holes (the second charges) to be transported from the second electrode 7 serving as the anode are less likely to be transported from the second layer 4b toward the first layer 4a and are likely to be confined in the third layer 4c and the first layer 5a. In other words, the first-quantum-dot containing layer 4 can reduce (block) transportation of the holes (the second charges). Such a feature allows the third layer 4c containing the first quantum dots in large amount and the first layer 5a containing the second quantum dots in large amount to further improve light emission efficiency.

Furthermore, because the second layer 5b of the second-quantum-dot containing layer 5 hardly contains the second quantum dots, the essential ingredient of the second layer 5b is a resin ingredient of the second photosensitive resin composition (e.g., a hardened material of the second photosensitive resin composition) to be used when the second layer 5b is formed. The example in FIG. 3 shows that the hardened material of the second photosensitive resin composition is lower in electron affinity than the hardened material of the first photosensitive resin composition, and that the electrons (the first charges) to be transported from the first electrode 2 serving as the cathode are less likely to be transported from the second layer 5b toward the second layer 5c and are likely to be confined in the third layer 4c and the first layer 5a. In other words, the second quantum-dot containing layer 5 can reduce (block) transportation of the electrons (the first charges). Such a feature can further improve the light emission efficiency of the third layer 5a containing the second quantum dots and the first layer 4c containing the first quantum dots in large amount.

Note that resin ingredients exhibiting preferable electron affinity and ionized energy are appropriately selected as the resin ingredients of the photosensitive resin compositions to be used when the first quantum-dot layer 4 and the second quantum-dot layer 5 are produced. Such a feature can control the transportation of the electrons and the holes as described above.

Furthermore, in the light-emitting element 100, for example, when a high voltage is applied between the first electrode 2 and the second electrode 7, the first charges to be transported from the first electrode 2 can pass through (tunnel) the second layer 5b and arrive at the third layer 5c. Thanks to such a feature, even in the third layer 5c containing the second quantum dots in large amount, the tunnelling first charges and the second charges transported from the second electrode 7 through the second-charge transport layer 6 can be recombined together to emit light.

Moreover, in the light-emitting element 100, when a high voltage is applied between the first electrode 2 and the second electrode 7, the second charges to be transported from the second electrode 7 can pass through (tunnel) the second layer 4b and arrive at the first layer 4a. Thanks to such a feature, even in the first layer 4a containing the first quantum dots in large amount, the tunnelling second charges and the first charges transported from the first electrode 2 through the first-charge transport layer 3 can be recombined together to emit light.

As can be seen, the first layer 4a and the third layer 5c also emit light, and the light-emitting element 100 can improve light emission efficiency.

Second Embodiment

Figure 4:
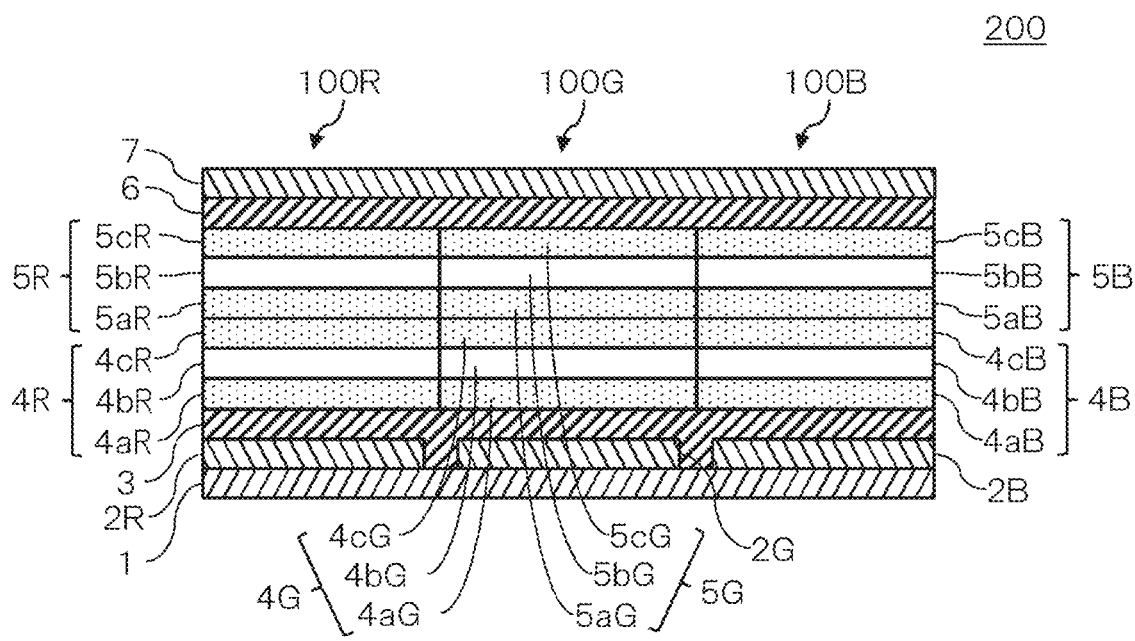
FIG. 4 is a schematic view of an exemplary multilayer structure of a light-emitting element according to a second embodiment.

FIG. 4 is a schematic view of an exemplary multilayer structure of a light-emitting element 200 according to this embodiment. FIGS. 5A to 5E are views showing an exemplary method for producing the light-emitting element 200 according to this embodiment.

The light-emitting element 200 of this embodiment is illustrated in FIG. 4. The light-emitting element 200 is, for example, a combination of a red light-emitting element 100R, a green light-emitting element 100G, and a blue light-emitting element 100B, all of which are the same in configuration as the light-emitting element 100 of the first embodiment. In the light-emitting element 200, the red light-emitting element 100R includes: a first-quantum-dot containing layer 4R containing first quantum dots; and a second-quantum-dot containing layer 5R containing second quantum dots. The first quantum dots and the second quantum dots emit a red light. Likewise, the green light-emitting element 100G includes: a first-quantum-dot containing layer 4G containing first quantum dots and a second-quantum-dot containing layer 5G containing second quantum dots. The first quantum dots and the second quantum dots emit a green light. Moreover, likewise, the blue light-emitting element 100B includes: a first-quantum-dot containing layer 4B containing first quantum dots; and a second-quantum-dot containing layer 5B containing second quantum dots. The first quantum dots and the second quantum dots emit a blue light. Note that the light-emitting element 200 of this embodiment includes light-emitting elements in three colors of red, green, and blue. Alternatively, the light-emitting element 200 may include a combination of light-emitting elements in two colors or in three colors or more.

Described below is an exemplary method for producing the light-emitting element 200 of this embodiment.

Figure 5A:
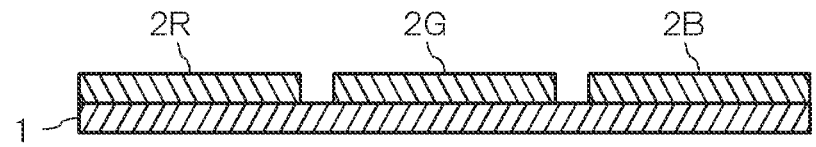
FIG. 5A is a view showing an exemplary method for producing the light-emitting element according to the second embodiment.

First, as illustrated in FIG. 5A, on the substrate 1, a first electrode 2R for a red light-emitting element, a first electrode 2G for a green light-emitting element, and a first electrode 2B for a blue light-emitting element are formed as seen at above S1 (S101).

Figure 5B:
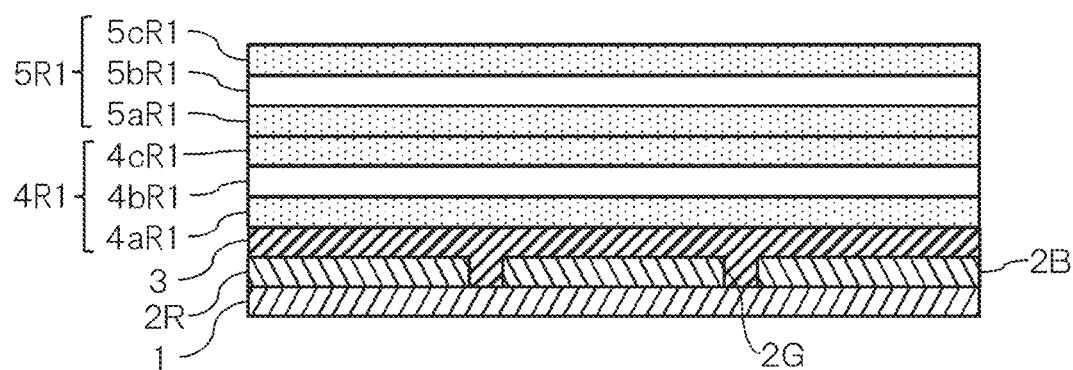
FIG. 5B is a view showing an exemplary method for producing the light-emitting element according to the second embodiment.

Next, as illustrated in FIG. 5B, the first-charge transport layer 3 is formed as seen at above S2 (S102).

Moreover, as seen at above S3, using a negative photosensitive resin composition, a first-quantum-dot containing layer 4R1 is formed (S103). The first-quantum-dot containing layer 4R1 includes: a first layer 4aR1 containing the first quantum dots in large amount, a second layer 4bR1 hardly containing the first quantum dots, and a third layer 4cR1 containing the first quantum dots in large amount.

Then, as seen at above S4, using a negative photosensitive resin composition, a first-quantum-dot containing layer 5R1 is formed (S104). The first-quantum-dot containing layer 5R1 includes: a first layer 5aR1 containing the second quantum dots in large amount, a second layer 5bR1 hardly containing the second quantum dots, and a third layer 5cR1 containing the second quantum dots in large amount.

Figure 5C:
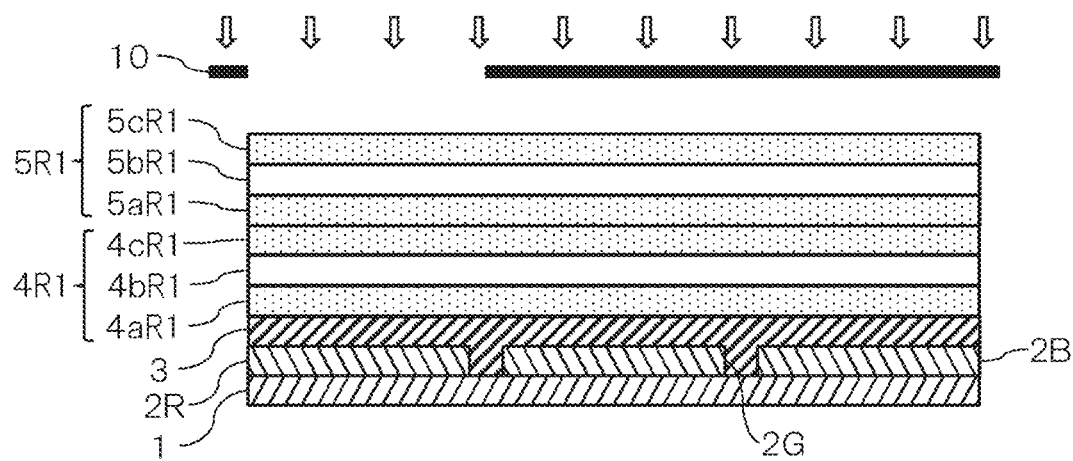
FIG. 5C is a view showing an exemplary method for producing the light-emitting element according to the second embodiment.

Next, as illustrated in FIG. 5C, for example, the first-quantum-dot containing layer 4R1 and the second-quantum-dot containing layer 5R1 are exposed to light in a predetermined pattern through a mask 10 having the predetermined pattern (S105). Hence, the first-quantum-dot containing layer 4R1 and the second-quantum-dot containing layer 5R1 have portions exposed to light and cured.

Figure 5D:
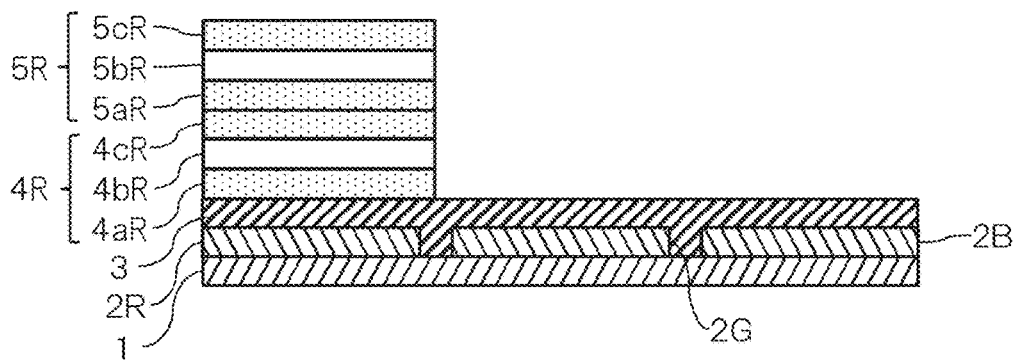
FIG. 5D is a view showing an exemplary method for producing the light-emitting element according to the second embodiment.

Moreover, through development, as illustrated in FIG. 5D, the first-quantum-dot containing layer 4R1 and the second-quantum-dot containing layer 5R1 are patterned to form the first-quantum-dot containing layer 4R and the second-quantum-dot containing layer 5R (S106).

At the above steps, the first-quantum-dot containing layer 4R1 and the second-quantum-dot containing layer 5R1 are simultaneously exposed to light and developed. However, the exposure and the development may be carried out in any given manner. The first-quantum-dot containing layer 4R1 and the second-quantum-dot containing layer SRI may be separately exposed to light and developed.

Furthermore, at S103 and S104, a negative photosensitive resin composition is used. Alternatively, a positive photosensitive resin composition may be used. If a positive photosensitive resin composition is used, a region to be exposed to light is reversed compared with a negative photosensitive resin composition. Then, the region exposed to light is removed and patterned by the development, eventually leaving the first-quantum-dot containing layer 4R and the second-quantum-dot containing layer 5R. The first-quantum-dot containing layer 4R and the second-quantum-dot containing layer 5R are post-baked and cured.

Figure 5E:
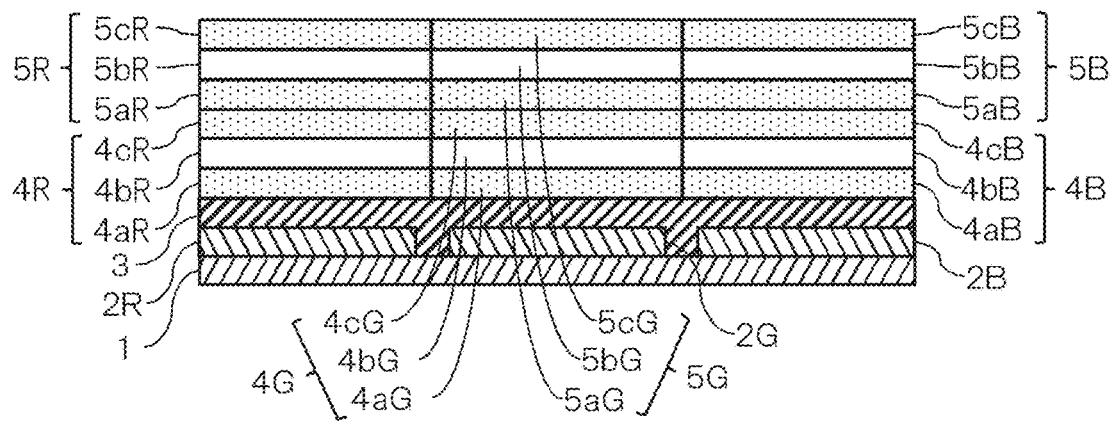
FIG. 5E is a view showing an exemplary method for producing the light-emitting element according to the second embodiment.

The colors are changed of light to be emitted from the first quantum dots and the second quantum dots contained in the photosensitive resin compositions, and above S104 to S106 are repeated. Hence, as illustrated in FIG. 5E, for example, in addition to the first-quantum-dot containing layer 4R containing quantum dots as the first quantum dots that emit a red light and the second-quantum-dot containing layer 5R containing quantum dots as the first quantum dots that emit a red light, formed are: the first-quantum-dot containing layer 4G containing quantum dots as the first quantum dots that emit a green light; the second-quantum-dot containing layer 5G containing quantum dots as the second quantum dots that emit a green light; the first-quantum-dot containing layer 4B containing quantum dots as the first quantum dots that emit a blue light; and the second-quantum-dot containing layer 5B containing quantum dots as the second quantum dots that emit a blue light (S107).

Moreover, as seen at above S5, on each of the second-quantum-dot containing layers 5R, 5G, and 5B, the second-charge transport layer 6 is formed (S108). Then, as seen at above S6, on the second-charge transport layer 6, the second electrode 7 is formed (S109). By the steps described above, as illustrated in FIG. 4, the light-emitting element 200 can be produced to include the red light-emitting element 100R, the green light-emitting element 100G, and the blue light-emitting element 100B. For example, the light-emitting elements 200 are arranged in a matrix to form a display device.

Figure 6:
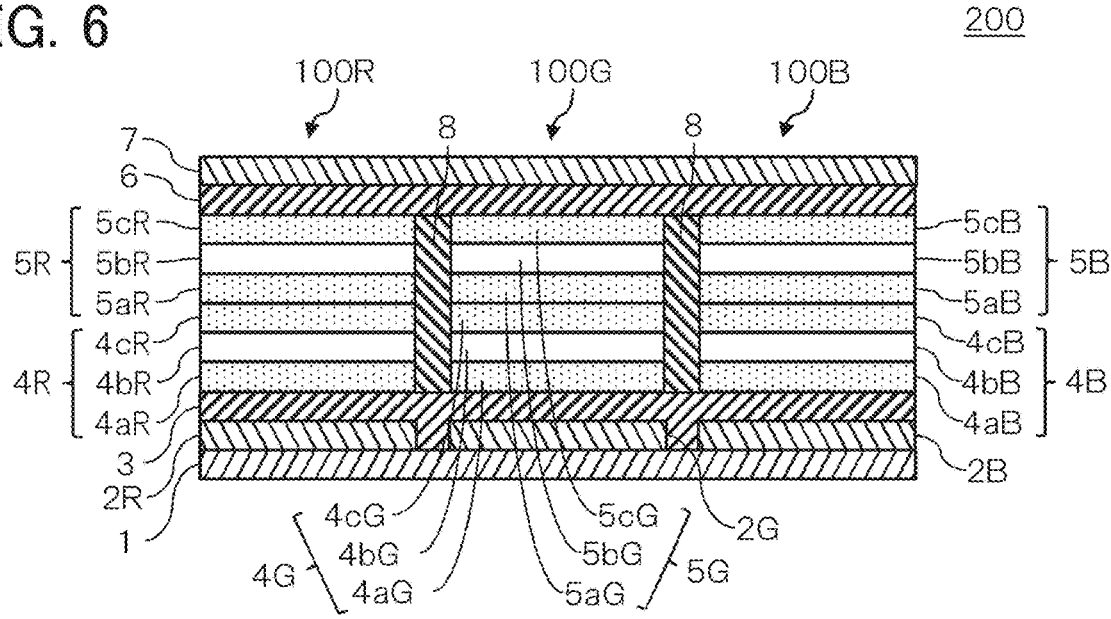
FIG. 6 is a schematic view of an exemplary multilayer structure of the light-emitting element in a modification according to the second embodiment.

Furthermore, before above S103, a bank may be formed to separate the red light-emitting element 100R, the green light-emitting element 100G, and the blue light-emitting element 100B from each other. The light-emitting element 200 in a modification of this embodiment includes a bank 8 that is, for example, an insulator. For example, as illustrated in FIG. 6, the bank 8 separates at least: the first quantum-dot layer 4R and the second quantum-dot layer 5R; the first quantum-dot layer 4G and the second quantum-dot layer 5G; and the first quantum-dot layer 4B and the second quantum-dot layer 5B from each other.

In the above light-emitting element 200, all of the red light-emitting element 100R, the green light-emitting element 100G, and the blue light-emitting element 100B can improve light emission efficiency, and the whole light-emitting element 200 can improve light emission efficiency.

The disclosure shall not be limited to the above embodiments, and may be replaced with configurations that are substantially the same as, that have the same advantageous effects as those of, and that achieve the same object as that of, the configurations described in the above embodiments.

The invention claimed is:

1. A light-emitting element producing method, comprising:
   forming a first-charge transport layer on a first electrode;
   applying a first photosensitive resin composition, containing first quantum dots, to the first-charge transport layer, and forming a first-quantum-dot containing layer;
   applying a second photosensitive resin composition, containing second quantum dots, to the first-quantum-dot containing layer, and forming a second-quantum-dot containing layer;

forming a second-charge transport layer on the second-quantum-dot containing layer; and forming a second electrode on the second-charge transport layer, wherein, in the first-quantum-dot containing layer, the first quantum dots are unevenly distributed toward the first-charge transport layer and the second-quantum-dot containing layer.

2. The light-emitting element producing method according to claim 1, wherein the first photosensitive resin composition contains at least a polyimide resin or an acrylic resin.

3. The light-emitting element producing method according to claim 1, wherein the second photosensitive resin composition contains at least a polyimide resin or an acrylic resin.

4. The light-emitting element producing method according to claim 1, wherein the first-quantum-dot containing layer blocks second charges to be injected from the second electrode.

5. The light-emitting element producing method according to claim 1, wherein the second-quantum-dot containing layer blocks first charges to be injected from the first electrode.

6. A light-emitting element producing method, comprising:

forming a first-charge transport layer on a first electrode;

applying a first photosensitive resin composition, containing first quantum dots, to the first-charge transport layer, and forming a first-quantum-dot containing layer;

applying a second photosensitive resin composition, containing second quantum dots, to the first-quantum-dot containing layer, and forming a second-quantum-dot containing layer;

forming a second-charge transport layer on the second-quantum-dot containing layer; and forming a second electrode on the second-charge transport layer, wherein, in the second-quantum-dot containing layer, the second quantum dots are unevenly distributed toward the first-quantum-dot containing layer and the second-charge transport layer.

7. The light-emitting element producing method according to claim 6, wherein the first photosensitive resin composition contains at least a polyimide resin or an acrylic resin.

8. The light-emitting element producing method according to claim 6, wherein the second photosensitive resin composition contains at least a polyimide resin or an acrylic resin.

9. The light-emitting element producing method according to claim 6, wherein the first-quantum-dot containing layer blocks second charges to be injected from the second electrode.

10. The light-emitting element producing method according to claim 6, wherein the second-quantum-dot containing layer blocks first charges to be injected from the first electrode.

11. A light-emitting element, comprising:

a first electrode;

a second electrode;

a light-emitting layer provided between the first electrode and the second electrode;

a first-charge transport layer provided between the first electrode and the light-emitting layer; and a second-charge transport layer provided between the second electrode and the light-emitting layer, wherein the light-emitting layer includes:

a first-quantum-dot containing layer positioned toward the first-charge transport layer and containing first quantum dots; and a second-quantum-dot containing layer positioned toward the second-charge transport layer and containing second quantum dots, and in the first-quantum-dot containing layer, the first quantum dots are unevenly distributed toward the first-charge transport layer and the second-quantum-dot containing layer.

12. The light-emitting element producing method according to claim 11, wherein, in the second-quantum-dot containing layer, the second quantum dots are unevenly distributed toward the first-quantum-dot containing layer and the second-charge transport layer.

13. The light-emitting element producing method according to claim 11, wherein the first-quantum-dot containing layer blocks second charges to be injected from the second electrode.

14. The light-emitting element producing method according to claim 11, wherein the second-quantum-dot containing layer blocks first charges to be injected from the first electrode.

15. The light-emitting element producing method according to claim 11, wherein the first-quantum-dot containing layer includes a hardened material of a first photosensitive resin composition.

16. The light-emitting element producing method according to claim 15, wherein the second-quantum-dot containing layer includes a hardened material of a second photosensitive resin composition that is different from the first photosensitive resin composition.

17. The light-emitting element producing method according to claim 16, wherein the first electrode is a cathode, the second electrode is an anode, the hardened material of the second photosensitive resin composition is lower in electron affinity than the hardened material of the first photosensitive resin composition, and the hardened material of the first photosensitive resin composition is higher in ionization potential than the hardened material of the second photosensitive resin composition.

* * * * *